United States Patent [19]

Shibagaki

[11] Patent Number: 4,885,054
[45] Date of Patent: Dec. 5, 1989

[54] ETCHING METHOD

[75] Inventor: Masami Shibagaki, Tokyo, Japan

[73] Assignee: Anelva Corporation, Tokyo, Japan

[21] Appl. No.: 265,351

[22] Filed: Oct. 28, 1988

Related U.S. Application Data

[63] Continuation-in-part of Ser. No. 23,746, Mar. 9, 1987, abandoned.

[30] Foreign Application Priority Data

Mar. 25, 1986 [JP] Japan .................................. 61-66650

[51] Int. Cl.$^4$ ............................................. C03C 15/00
[52] U.S. Cl. .................................... 156/643; 156/646; 156/662
[58] Field of Search ..................... 156/643, 646, 662; 252/79.1

[56] References Cited

U.S. PATENT DOCUMENTS

| | | | |
|---|---|---|---|
| 3,907,607 | 9/1975 | Chu et al. | 156/646 |
| 4,069,090 | 1/1978 | Reinberg et al. | 156/646 |
| 4,079,506 | 3/1978 | Suzuki et al. | 156/649 |
| 4,383,885 | 5/1983 | Maydan et al. | 156/646 |
| 4,412,119 | 10/1983 | Komatsu et al. | 156/646 |
| 4,422,897 | 12/1983 | Horwitz | 156/646 |
| 4,430,151 | 2/1984 | Tsukada | 156/662 |
| 4,450,042 | 5/1984 | Purdes | 156/646 |
| 4,490,209 | 12/1984 | Hartman | 156/643 |
| 4,544,444 | 10/1985 | Chang | 156/646 |
| 4,601,779 | 7/1986 | Abernathy et al. | 252/79.1 |

Primary Examiner—David Lacey
Assistant Examiner—L. Johnson
Attorney, Agent, or Firm—Pollock, VandeSande & Priddy

[57] ABSTRACT

An etching method for etching a masked silicon substrate in a vessel by introducing into the vessel an etching gas containing a gaseous chloride of silicon and a nitrogen-containing gas and converting the etching gas introduced in the vessel into a plasma. Ions and radicals are formed from the etching gas under plasma conditions, the ions impinging against the substrate in a sputtering action, and the radicals acting on the substrate to produce a volatile substance. The sputtering action and the volatile substances produce even etched surfaces without surface defects and simultaneously prevent the formation of a white powder, thus avoiding unetched or insufficiently etched portions and portions appearing to be black. In addition, this method makes it possible to realize superior anisotropism in the etching, while increasing the speed and selectivity of etching.

14 Claims, 5 Drawing Sheets

Mask
Silicon Substrate

FIG_4
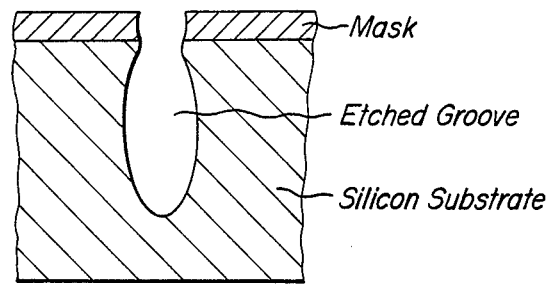
FIG_5
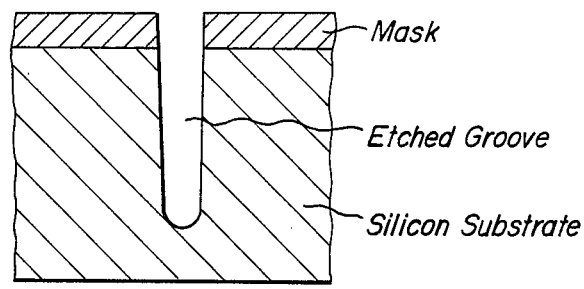
FIG_6
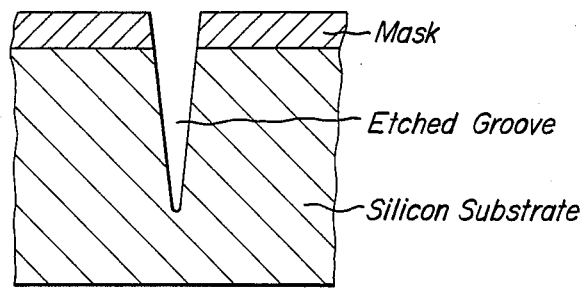

FIG_7
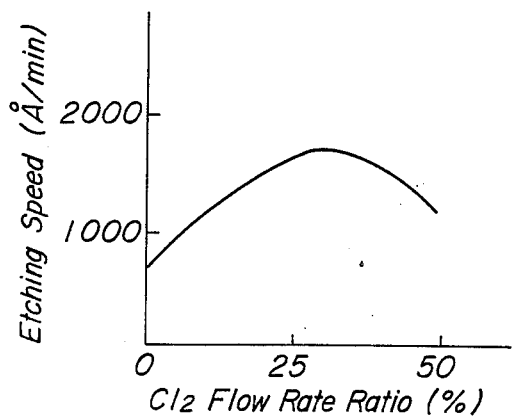
FIG_8
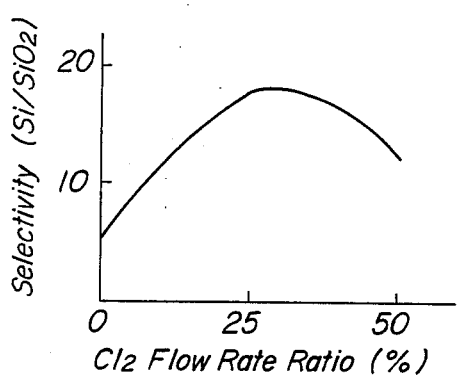

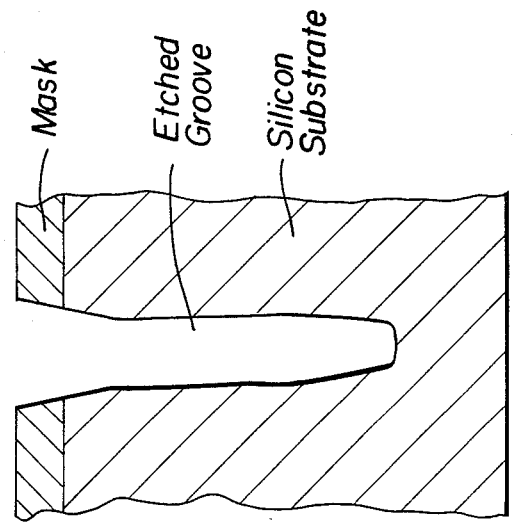
FIG_11
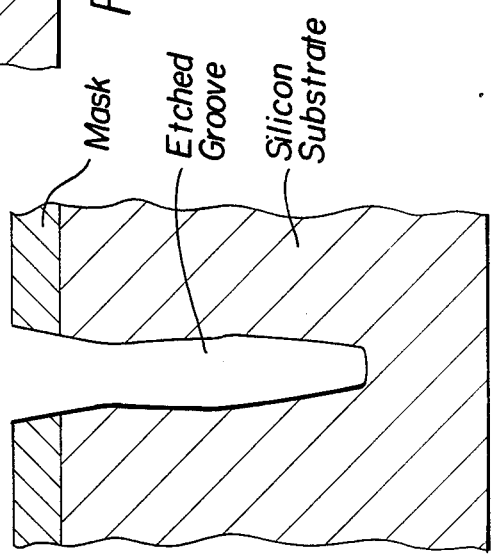
FIG_10
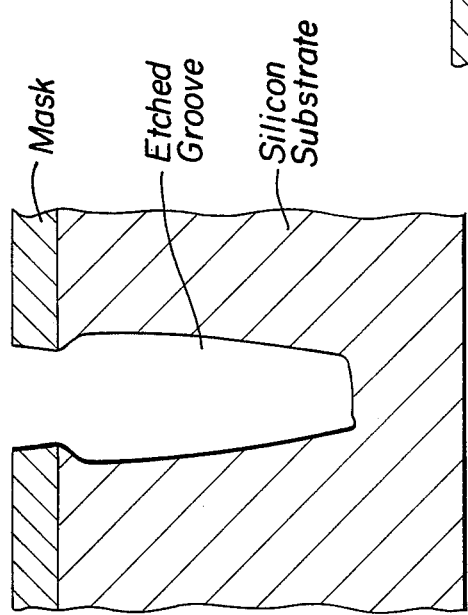
FIG_9

ETCHING METHOD

This application is a continuation-in-part of application Ser. No. 023,746, filed Mar. 9, 1987, now abandoned.

BACKGROUND OF THE INVENTION

This invention relates to an etching method for forming deep grooves in a semiconductor substrate by reactive ion etching.

In general, wet etching using an etching liquid has been widely used for producing semiconductor circuits and the like for many years. However, wet etching has many disadvantages such as the occurrence of undercutting. As the requirement of much finer circuit patterns increases with improved integrated degrees and the like, so-called dry etching methods without using any etching agent have been proposed. Among them, the reactive ion etching method has been of particularly note. This method uses parallel plate electrodes and accomplishes simultaneous use of physical etching such as sputtering or the like and chemical etching by a chemical reaction.

With this method, the parallel plate electrodes are arranged in a reaction vessel, and after a substrate to be etched has been located on one of the electrodes, an etching gas under a predetermined pressure is introduced into the reaction vessel. A predetermined high frequency electric power is then applied to the parallel plate electrodes in the etching gas atmosphere to produce a plasma in the reaction vessel. The resulting physical and chemical reactions etch the substrate.

In etching a silicon substrate by the reactive ion etching method of this kind in general, various gases are used for this purpose. In most cases, the gases are fluorinated hydrocarbon compounds such as $CF_4$, $CHF_3$, other hydrocarbon fluoride compounds and the like, gases containing chlorine, and gases containing bromine.

However, etching using a gaseous fluorine compound is likely to cause undercutting resulting in a problem in processing accuracy. On the other hand, etching using a chlorine-containing gas has less chance of side etching in comparison with that using a gaseous fluorine compound; however, there is a tendency in using a chlorine-containing gas for a surface of a silicon substrate to be etched into a rough surface which appears to be black. In etching using the bromine-containing gas, moreover, side walls of grooves formed by the etching often leave projections thereon to form rough surfaces.

Furthermore, in the respective etching methods using the above various gases, side walls of etched grooves tend to be curved, thus deviating from desired vertical surfaces, and sometimes fine grooves are unintentionally formed in bottoms of the etched grooves. Etching using silicon tetrachloride ($SiCl_4$) and oxygen ($O_2$) exhibits a high selectivity for silicon dioxide which is usually used as masks and achieves comparatively good etched configurations in comparison with the etching methods using the other gases. However, reaction products consisting of silicon and oxygen compounds formed in etching produce a white powder which contaminates the reaction vessel and the substrates. Moreover, the white powder acts as if it were a mask at locations to be etched, so that portions of a substrate to be etched remain unetched even after an etching step. A substrate is etched faster at a portion surrounding the white powder than at a portion in direct contact with the white powder, so that grooves are formed in bottoms of etched grooves or the bottoms are uneven or appear to be black. Furthermore, in etching using silicon tetrachloride, the etched configuration is likely to be detrimentally affected by residual gases in the reaction vessel, with the result that the etched configuration tends to be unstable.

With the above etching methods using the various kinds of gases, grooves not having undersized curved portions, i.e., "anisotropic etching" may be temporarily accomplished by properly adjusting various etching conditions such as the flow rate ratio (a ratio of gas to the total volumetric flow rate). However, setting the etching conditions is very delicate, so that even if the etching is effected with the same conditions, the etching is not reproducible.

SUMMARY OF THE INVENTION

It is the object of the invention to provide an improved etching method which solves the problems of the prior art above described and prevents the formation of white powder accompanied with the etching, prevents incomplete etching and a black appearance of a silicon substrate, and is reproducible in performing anisotropic etching.

In order to accomplish this object, in accordance with the invention, a method of etching a substrate in a vessel is carried out by introducing into the vessel an etching gas which contains a gaseous chloride of silicon and a nitrogen-containing gas and converting the resulting etching gas into a plasma.

In a preferred embodiment of the invention the nitrogen-containing gas is nitrogen gas and/or a gaseous nitrogen compound.

In another embodiment, the nitrogen-containing gas is a mixture of nitrogen gas and a chlorine-containing gas.

In a further embodiment of the invention, the nitrogen-containing gas is a nitrogen compound gas and a chlorine-containing gas.

With these features according to the invention, in etching a silicon substrate masked by silicon dioxide, the etching is performed by converting a gaseous mixture of a gaseous chloride of silicon and a nitrogen-containing gas as an etching gas into a plasma.

In other words, by converting the etching gas into a plasma, ions and radicals are produced. The ions impinge against the substrate as a sputtering action, while a reaction between the radicals and the silicon substrate produces a volatile substance. The etching is accomplished by the sputtering action and the production of the volatile substance. In this case, because the etching gas does not contain oxygen according to the invention, the white powder as the reaction product of the silicon chloride and oxygen is not produced. Moreover, the silicon chloride gas and the nitrogen-containing gas used as an etching gas achieves anisotropic etching which is superior in reproducibility and increases both the speed and selectivity of etching.

In this etching process, nitrogen does not serve as a diluent gas, but enters into a chemical reaction. For example, silicon tetrachloride ($SiCl_4$) and nitrogen ($N_2$) react to form $SiN_x$ and $Cl_2$. Under certain conditions, a $SiN_x$ film may be deposited or formed on the side walls of the grooves being formed in a substrate by the etching and protects the side wall from an etching reaction, thus achieving the anisotropic etching of the silicon substrate.

In order that the invention may be more clearly understood, preferred embodiments will be described, by way of example, with reference to the accompanying drawings.

BRIEF DESCRIPTION OF THE DRAWINGS

FIG. 4 is a sectional view illustrating a configuration of an etched groove at a nitrogen flow rate ratio of 5%;

FIG. 5 is a sectional view illustrating a configuration of an etched groove at a nitrogen flow rate ratio of 30% and a chlorine flow rate of 30%;

FIG. 6 is a sectional view illustrating a configuration of an etched groove at a nitrogen flow rate ratio of 60%;

FIG. 7 is a diagram showing the relationship between chlorine flow rate ratio and etching speed;

FIG. 8 is a diagram showing the relationship between a chlorine flow rate ratio and etching selectivity.

FIG. 9 is a sectional view illustrating the configuration of an etched groove formed at a nitrogen flow rate of 0%;

FIG. 10 is a sectional view illustrating the configuration of an etched groove formed at a nitrogen flow rate ratio of 25%;

FIG. 11 is a sectional view illustrating the configuration of an etched groove at a nitrogen flow rate ratio of 50%;

DESCRIPTION OF THE PREFERRED EMBODIMENTS

The nitrogen-containing gas provides advantages even in concentrations as low as 5% by volume or lower. The concentration of nitrogen-containing gas in the etching gas is preferably in the range from about 10 volume percent to about 55 volume percent. The optimum concentration of nitrogen-containing gas depends to some degree upon the concentration of additional gases in the gaseous mixture such as, for example, chlorine. For example, a preferred concentration is about 30% nitrogen in a mixture which also containing about 30% chlorine. This mixture achieves a high selectivity, a high etching rate, and good anisotropy. In the absence of significant amounts of chlorine gas in the mixture, a concentration of nitrogen in the range of about 45% to about 55% is most preferred.

A more detailed description of the apparatus, materials, a method of etching is set forth below.

Apparatus

Apparatus for carrying out the etching method according to the invention is similar to those used in carrying out methods of the prior art, and comprises a reaction vessel for accommodating a substrate, gas supply means for supplying an etching gas to the reaction vessel, plasma-producing means for forming a plasma from the etching gas introduced into the reaction vessel and vacuum means for evacuating the reaction vessel. The plasma-producing means comprises a pair of plate electrodes arranged in opposition to each other in the reaction vessel and a power source for applying electric voltage across the plate electrodes. The application of the voltage to the electrodes causes an electric field between the plate electrodes to produce a plasma from the etching gas introduced into the reaction vessel.

Material for the Etching

Figure 1:
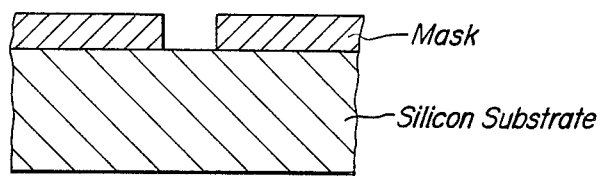
FIG. 1 is a view illustrating an arrangement of a silicon substrate and a mask.

Silicon substrates were used as substrates to be etched, and silicon dioxide films, each formed with a circuit pattern were used as masks. As shown in FIG. 1, a mask was provided on a surface of a silicon substrate to be etched.

In etching, the silicon substrate was located on a side of one of the plate electrodes (on a side of a high frequency power).

Etching Method

The etching method is similar to the prior art with the exception that the composition of the etching gas is different from those of the prior art.

In other words, the silicon substrate covered by the mask as shown in FIG. 1 was arranged on one of the plate electrodes to which electric voltage was applied, while an etching gas was introduced into the evacuated reaction vessel to form plasma from the etching gas. In this manner, the silicon substrate was etched by sputtering and chemical reaction of the plasma.

Etching Gas

In a first embodiment, the gaseous mixture consists of silicon tetrachloride ($SiCl_4$) gas and nitrogen-containing gas (nitrogen gas or nitrogen compound gas), while in a second embodiment, the gaseous mixture consists of silicon tetrachloride ($SiCl_4$), a nitrogen-containing gas and chlorine ($Cl_2$) gas. Concrete embodiments of these two cases using the gaseous mixtures will be explained hereinafter.

1. First embodiment

The etching performance on the substrate was studied with a variation of the flow rate ratio of nitrogen ($N_2$) in the gaseous mixture consisting of silicon tetrachloride ($SiCl_4$) gas and a nitrogen-containing gas.

Figure 2:
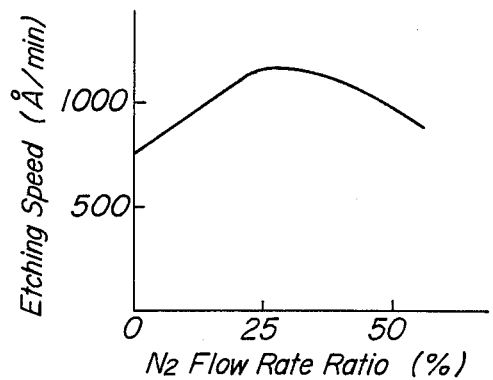
FIG. 2 is a diagram showing the relationship between the nitrogen flow rate ratio and etching speed.

FIG. 2 illustrates a characteristic diagram showing the relationship between etching speed and the nitrogen flow rate ratio. According to this result, the etching speed is the maximum in the proximity of 30% of the nitrogen flow rate ratio.

Figure 3:
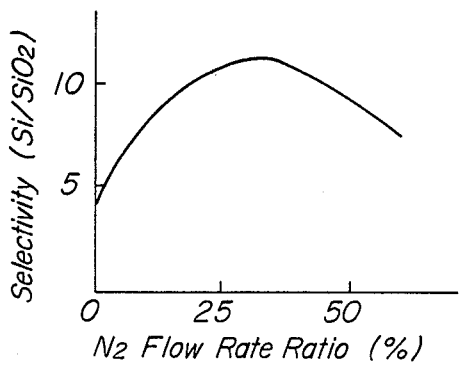
FIG. 3 is a diagram showing the relationship between the nitrogen flow rate ratio and etching selectivity.

FIG. 3 illustrates the relationship between the nitrogen flow rate ratio and selectivity (a ratio of the etching ratio of silicon to that of silicon dioxide ($SiO_2$)). In this case, the selectivity is also the maximum in the proximity of 30% of the nitrogen flow rate ratio.

It is evident from the above results that when an etching gas consisting of silicon tetrachloride ($SiCl_4$) and a nitrogen-containing gas is used, the etching speed becomes more than 1000 Å/min at 30% of the nitrogen flow rate ratio and the selectivity to silicon dioxide of the mask is more than 10 so that the ideal etching characteristics are obtained.

FIGS. 4 and 6 illustrate etched configurations for nitrogen flow rate ratios of 5% and 60%, respectively. As can be seen from FIG. 4, side walls of an etched groove 3 are curved when the nitrogen flow rate ratio is 5%. As shown in FIG. 6, the etched groove is tapered when the nitrogen flow rate is 60%.

When the nitrogen and chlorine flow rate ratios are each 30%, an ideal anisotropic etched configuration is obtained as shown in FIG. 5.

Etched grooves formed in a substrate (wafer) were observed by a scanning electron microscope to ascertain uniform depths of the grooves.

Experiments were carried out etching silicon wafers which were masked with $SiO_2$ using various gaseous mixtures. All conditions except the composition of the gaseous mixture, such as pressure, net power, etch time and distance between electrodes were maintained constant. The cross-sectional shapes of the resulting etched grooves were established by a scanning electron microscope and are as shown in FIGS. 9-13. The composition of the gaseous mixture for each experiment is given in the following Table:

TABLE

| Run No. | Corresponding FIG. | Gas Flow Rate Sccm | | | % N | Ar |
| --- | --- | --- | --- | --- | --- | --- |
| | | $SiCl_4$ | $N_2$ | Ar | | |
| 1 | 9 | 40 | 0 | 0 | 0 | 0 |
| 2 | 10 | 30 | 10 | 0 | 25 | 0 |
| 3 | 11 | 20 | 20 | 0 | 50 | 0 |
| 4 | 12 | 10 | 30 | 0 | 75 | 0 |
| 5 | 13 | 20 | 0 | 20 | 0 | 50 |

Figure 13:
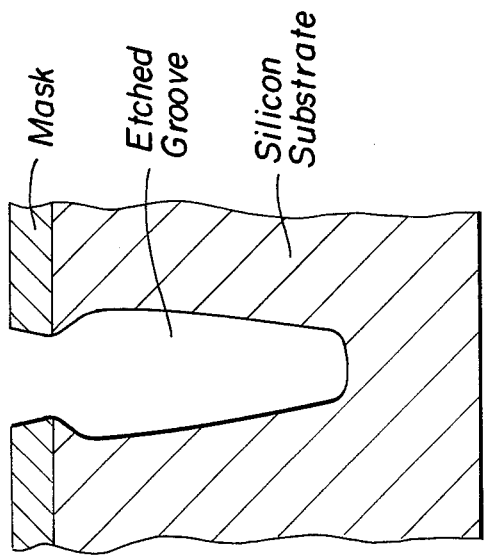
FIG. 13 is a section view illustrating the configuration of an etched groove at a nitrogen flow rate of 0% and an argon flow rate ratio of 50%.
Figure 12:
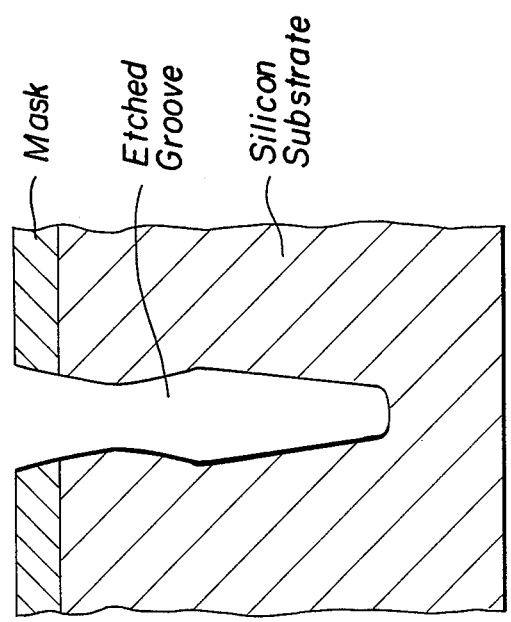
FIG. 12 is a sectional view illustrating the configuration of an etched groove at a nitrogen flow rate ratio of 75%.

A comparison of FIGS. 9, 11 and 13 show that while a 50% concentration of nitrogen (FIG. 11) results in a highly anisotropic groove, a 50% concentration of argon (FIG. 13) does not improve the anisotrophy over a pure $SiCl_4$ gas (FIG. 9) and appears to be deleterious.

2. Second embodiment

The mixture of gases consisting of silicon tetrachloride ($SiCl_4$), nitrogen gas and chlorine ($Cl_2$) gas was used to etch silicon substrates.

The chlorine gas served to increase the etching speed. FIG. 7 is a graph illustrating the relationship between the etching speed and the chlorine flow rate ratio. As seen from the graph shown in FIG. 7, the etching speed is the maximum at 30% of the chlorine flow rate ratio.

FIG. 8 is a graph illustrating the relationship between the selectivity and the chlorine flow rate ratio. In this case, likewise, the selectivity is the maximum at 30% of the chlorine flow rate ratio. In the second embodiment, the ideal etched configurations were obtained as shown in FIG. 5, when the nitrogen flow rate ratio and the chlorine flow rate ratio were both 30%.

In this second embodiment, moreover, the etching speed could be increased by adding chlorine gas to the etching gas. Under such circumstances, superior etching characteristics were obtained such as etching speeds more than 1500 Å/min and selectivity more than 15, while the ideal etched configurations were obtained.

In the above first and second embodiments, no white powder from reaction products occurred in etching, and therefore, very clear etched configurations were obtained without any contamination of the silicon substrates and insides of the reaction vessels. Moreover, there were no defects such as unetched or insufficiently etched portions, uneven bottoms of etched grooves, surfaces which appeared to be black and the like such as would occur in the prior art. Moreover, residual etching gases had little effect on the silicon substrates. In this manner, anisotropic etched products which are superior in reproductivity were realized.

Although silicon tetrachloride ($SiCl_4$) had been used as etching gases in the above embodiments, it was only by way of example and other gaseous chlorides of silicon, such as, for example, trichlorosilane ($SiHCl_3$) may be used for this purpose.

Either nitrogen gas or a gaseous nitrogen compound gas was used as the nitrogen-containing gas in the above embodiment. In all cases using these gases, respectively, the same good results were obtained. It was further ascertained that the same good result was obtained by the use of a gaseous mixture of nitrogen gas and a gaseous nitrogen compound as the nitrogen-containing gas.

Moreover, although the reactive ion etching apparatus equipped with opposite flat plate electrodes was used in the above embodiments, other reactive ion etching systems may be used with the same good results. These systems include hexagonal column electrode etching apparatus, an etching system using electronic cyclotron resonance, a reactive ion beam etching system and ion assist beam etching.

According to the present invention the etching gas consisting mainly of a gaseous chloride of silicon and a nitrogen-containing gas is used to obtain even etched surfaces without surface defects and unevenness and at the same time prevent the formation of white powder thus avoiding silicon substrates having unetched or insufficiently etched portions, or portions which appeared to be black. Moreover, the etching method according to the invention makes it possible to stably and easily achieve etching which is superior in anisotropism by properly setting etching conditions.

It is further understood by those skilled in the art that the foregoing description is that of preferred embodiments of the disclosed method and that various changes and modifications may be made in the present invention without departing from the spirit and scope thereof.

What is claimed is:

1. A method of etching a silicon substrate in a vessel comprising providing in a vessel, a silicon substrate introducing into said vessel an etching gas wherein said etching gas consists essentially of a gaseous chloride of silicon and a nitrogen-containing gas with or without chlorine as reactive agents, converting said etching gas into a plasma and etching said silicon substrate.

2. A method of etching as set forth in claim 1, wherein said gaseous chloride of silicon is silicon tetrachloride.

3. A method of etching as set forth in claim 1, wherein said gaseous chloride of silicon is trichlorosilane.

4. A method of etching as set forth in claim 1, wherein said nitrogen-containing gas is nitrogen.

5. A method of etching as set forth in claim 1, wherein said nitrogen-containing gas is a gaseous compound of nitrogen.

6. A method of etching as set forth in claim 1, wherein said nitrogen-containing gas is a mixture of nitrogen and a gaseous nitrogen compound.

7. A method of etching as set forth in claim 1, wherein said etching gas contains a mixture of nitrogen and chlorine.

8. A method of etching as set forth in claim 1, wherein said etching gas contains a mixture of a gaseous compound of nitrogen and chlorine.

9. A method of etching as set forth in claim 1, wherein said nitrogen-containing gas is present in a concentration sufficient to provide a substantially anisotropically etched configuration in said silicon substrate.

10. A method of etching as set forth in claim 1, wherein said etching gas contains nitrogen in a concentration from about 10 percent to about 55 percent by volume.

11. A method of etching as set forth in claim 1, wherein said nitrogen-containing gas is present in a concentration of about 30 percent by volume.

12. A method of etching as set forth in claim 1, wherein said etching gas contains nitrogen in a concentration from about 45 percent to about 55 percent by volume.

13. A method of etching as set forth in claim 1, wherein said etching gas contains chlorine gas in a concentration of about 30 percent by volume.

14. A method of etching as set forth in claim 1, wherein said etching gas contains nitrogen in a concentration of about 30 percent and chlorine gas in a concentration of about 30 percent by volume.

* * * * *

UNITED STATES PATENT AND TRADEMARK OFFICE
CERTIFICATE OF CORRECTION

PATENT NO. : 4,885,054
DATED : December 5, 1989
INVENTOR(S) : Masami Shibagaki

It is certified that error appears in the above-identified patent and that said Letters Patent is hereby corrected as shown below:

Column 1, line 20, change "particularly" to --particular--.

Column 3, line 54, change "containing" to --contains--.

Column 5, in the Table, under "% N" change ".0" to --0--;

line 27, change "show" to --shows--.

Signed and Sealed this

Twenty-first Day of July, 1992

Attest:

DOUGLAS B. COMER

*Attesting Officer*     *Acting Commissioner of Patents and Trademarks*